US006469649B1

United States Patent
Helkey et al.

(10) Patent No.: US 6,469,649 B1
(45) Date of Patent: Oct. 22, 2002

(54) NARROWBAND ANALOG TO DIGITAL CONVERTER WITH SUPPRESSED SECOND-ORDER DISTORTION

(75) Inventors: Roger Helkey, Montecito, CA (US); Jonathan Twichell, Acton, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/520,912

(22) Filed: Mar. 8, 2000

(51) Int. Cl.[7] .............................................. H03M 1/12
(52) U.S. Cl. ........................................ 341/155; 341/143
(58) Field of Search .................................. 341/155, 143, 341/110, 144, 160, 153, 135

(56) References Cited

U.S. PATENT DOCUMENTS

| | | | |
|---|---|---|---|
| 3,670,166 A | 6/1972 | Kaminow | 250/199 |
| 3,997,894 A | 12/1976 | Levine | 340/347 |
| 4,058,722 A | 11/1977 | Taylor | 250/225 |
| 4,502,037 A | 2/1985 | Le Parquier et al. | 340/347 |
| 4,694,276 A | 9/1987 | Rastegar | 340/347 |
| H353 H | 10/1987 | Taylor | 340/347 |
| 4,770,483 A | 9/1988 | Ridgway | 350/96.13 |
| 5,002,353 A | 3/1991 | Johnson | 350/96.14 |
| 5,010,346 A | 4/1991 | Hamilton et al. | 341/137 |
| 5,148,503 A | 9/1992 | Skeie | 385/3 |
| 5,249,243 A | 9/1993 | Skeie | 385/3 |
| 5,488,503 A | 1/1996 | Schaffner et al. | 359/245 |
| 5,629,699 A | 5/1997 | Chazelas et al. | 341/137 |
| 5,828,329 A | * 10/1998 | Burns | 341/155 |
| 6,028,424 A | 2/2000 | Twichell et al. | 324/96 |
| 6,160,505 A | * 12/2000 | Vaishampayan | 341/143 |
| 6,160,506 A | * 12/2000 | Pellon | 341/143 |

OTHER PUBLICATIONS

H.F. Taylor, "An Optical Analog–to–Digital Converter—Design and Analysis," IEEE Journal of Quantum Electronics, vol. 15, p. 210–216 (1979).
J.A. Bell et al., "Optical Sampling and Demultiplexing Applied to A/D Conversion," Devices for Optical Processing, Proc. SPIE, vol. 1562, 276–280 (1991).
R. Helkey, "A New Receiver Filter Transformation," Microwave Journal, p. 207–212 (Sep. 1990).
E. Ackerman et al., "Balanced Receiver External Modulation Fiber–Optic Link Architecture With Reduced Noise Figure," IEEE MIT–S Symposium Digest, p. 615–618 (1993).
G. Betts et al., A Linearized Modulator for High Performance Bandpass Optical Analog Links, IEEE MIT–S Symposium Digest, p. 1097–1100 (1994).
M. Farwell et al., "An Electrooptic Intensity Modulator with Improved Linearity," IEEE Photonics Technology Letters, vol. 3, p. 792–795 (1991).
C. Sun et al., "Efficient Microwave Frequency Conversion Using Photonic Link Signal Mixing," IEEE Photonics Technology Letters, vol. 8, p. 154–156 (1996).

* cited by examiner

*Primary Examiner*—Peguy JeanPierre
*Assistant Examiner*—Joseph Lauture
(74) *Attorney, Agent, or Firm*—Testa, Hurwitz & Thibeault, LLP

(57) ABSTRACT

An apparatus for digitizing an analog electrical signal comprises a linearized sampler having an analog electrical input and a sampling input, a bandpass filter having a center frequency of at least half of the quantization rate of a quantizer in communication with the sampler, and the quantizer in communication with the bandpass filter. The linearized sampler in one embodiment is a linearized optical modulator with an optical input. The sampler frequency in another embodiment is chosen such that second-order distortion products generated in the sampler are separated in frequency from the sampled input band.

31 Claims, 12 Drawing Sheets

NARROWBAND ANALOG TO DIGITAL CONVERTER WITH SUPPRESSED SECOND-ORDER DISTORTION

GOVERNMENT SUPPORT

This invention was made with government support under Contract Number F19628-95-C-0002 awarded by the Air Force. The government has certain rights in the invention.

FIELD OF THE INVENTION

This invention relates generally to the field of analog to digital conversion and more specifically to high performance analog-to-digital conversion using a linearized sampler.

BACKGROUND OF THE INVENTION

An analog to digital (A/D) converter is an important element in systems that use digital analysis or digital control of analog inputs. The A/D converter may be part of a large analog system, and is frequently the component that limits the performance of the system. Two specific performance parameters of A/D converters are resolution and sampling rate. Higher resolution A/D converters typically require a large signal to noise ratio and good linearity. A/D converters with high sampling rates are frequently desired, but generally have lower resolution. Therefore, a tradeoff is usually made between sampling rate and resolution.

Analog to digital conversion of a continuous input signal normally occurs in two steps—sampling and quantization. The sampler takes a time-varying analog input signal and converts it to a fixed voltage, current, electrical charge, or other output level. The quantizer takes the constant sampled level and compares it to the closest level from a discrete range of values called quantization levels.

Performance of high frequency analog to digital converters can be limited by timing jitter (variations in the sample taking) in an electrical sampler. However, the use of an optical modulator for sampling as compared to an electrical sampler can result in higher performance with lower timing jitter. Optical modulators used for sampling have an analog electrical input signal applied to them as well as an optical input signal. The optical input signal is modulated at a predetermined frequency to facilitate the sampling of the analog electrical input signal. Early optically sampling A/D converters used multiple modulators so that both sampling and quantization could be done optically. Other configurations used a single modulator as an optical sampler together with an electrical quantizer. The optical sampler/electrical quantizer approach has the performance advantage of optics for the sampler, but the simplicity and higher resolution of electronics for the quantizer.

Previously, the linearity of the optical sampler/electrical quantizer configuration was severely limited by nonlinearities in the optical sampler. These nonlinearities can appear in the output of the optical sampler as higher order noise. However, electrical or optical linearization techniques applied to the optical sampler can substantially reduce the effect of this nonlinearity. In the case of optical linearization, the best performing linearized optical modulators used for optical sampling can only deliver third-order linearization, with the tradeoff that second-order distortion remains in the output signal. What is needed is an optical sampler/electrical quantizer configuration in which second-order modulator distortion products can be rejected.

SUMMARY OF THE INVENTION

The invention relates to an apparatus for digitizing a narrowband analog electrical signal. The apparatus includes a linearized sampler having an analog electrical input and a sampling input; a bandpass filter, in communication with the sampler, having a center frequency of at least half of the quantization rate of a quantizer; and the quantizer in communication with the bandpass filter.

In one embodiment, the apparatus includes an optical sampler, which includes a modulated optical source in optical communication with an optical modulator, an optical to electrical converter, a bandpass filter having a center frequency of at least half of the quantization rate of a quantizer, and the quantizer.

The sampler frequency in another embodiment is chosen such that second-order distortion products generated in the sampler are separated in frequency from the sampled input band.

In another embodiment the modulated optical source is a laser. In yet another embodiment the optical to electrical converter is a photodetector. In still another embodiment, an optical isolator is in optical communication with the modulated optical source. In another embodiment, an optical amplifier is in optical communication with the modulated optical source. In yet another embodiment an optical filter is in optical communication with the optical amplifier.

In still another embodiment, the optical modulator is a Mach-Zehnder optical modulator.

BRIEF DESCRIPTION OF THE DRAWINGS

This invention is pointed out with particularity in the appended claims. The above and further advantages of this invention may be better understood by referring to the following description taking in conjunction with the accompanying drawings, in which:

DETAILED DESCRIPTION

Figure 1:
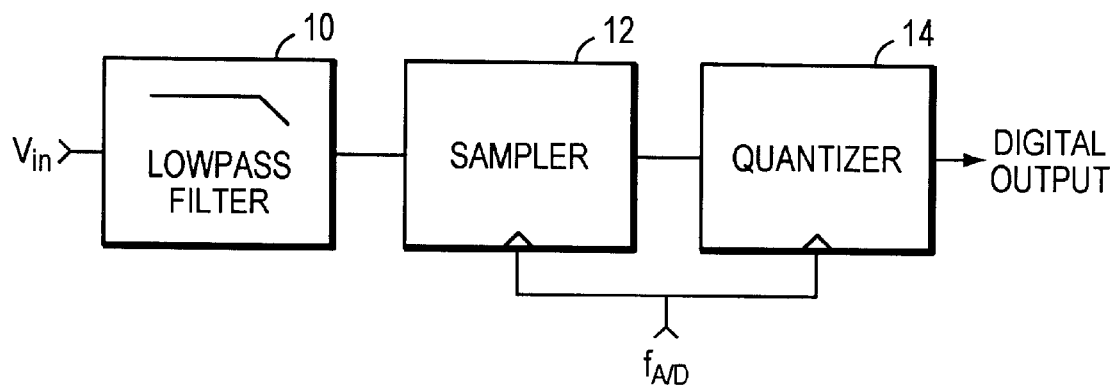
FIG. 1 is a block diagram of a conventional analog to digital converter known to the prior art.

A conventional analog to digital converter is shown in FIG. 1 and typically consists of a lowpass filter 10, a sampler 12, and a quantizer 14. The analog input signal ($V_{in}$) is applied to lowpass filter 10. The output of lowpass filter 10 is connected to the input of sampler 12. The output of sampler 12 is connected to the input of quantizer 14. The quantizer 14 outputs a digitized signal which corresponds to the analog input signal. Since real analog signals typically contain frequency components which include all frequencies and frequency harmonics, lowpass filter 10 is introduced before the sampling process to ensure that only band-limited signals are sampled.

Digital signals, from a processing point of view, are easier in general to deal with than analog signals. In many cases, it is desirable to convert analog signals to digital signals. In order to accomplish this conversion, the analog signal must first be sampled at a periodic rate and then further converted to discrete amplitude samples by quantization. This is typically accomplished through the use of an analog-to-digital (A/D) converter.

Figure 2:
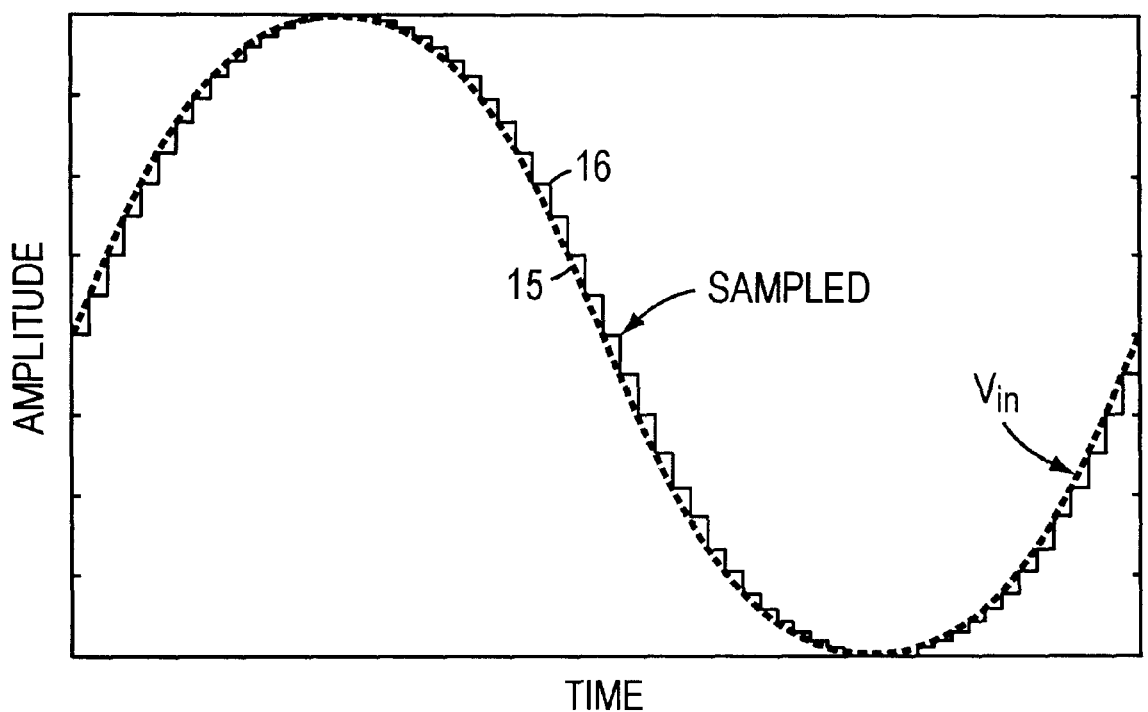
FIG. 2 is a graph showing the input signal and the sampled signal in a typical analog to digital converter known to the prior art.
Figure 3:
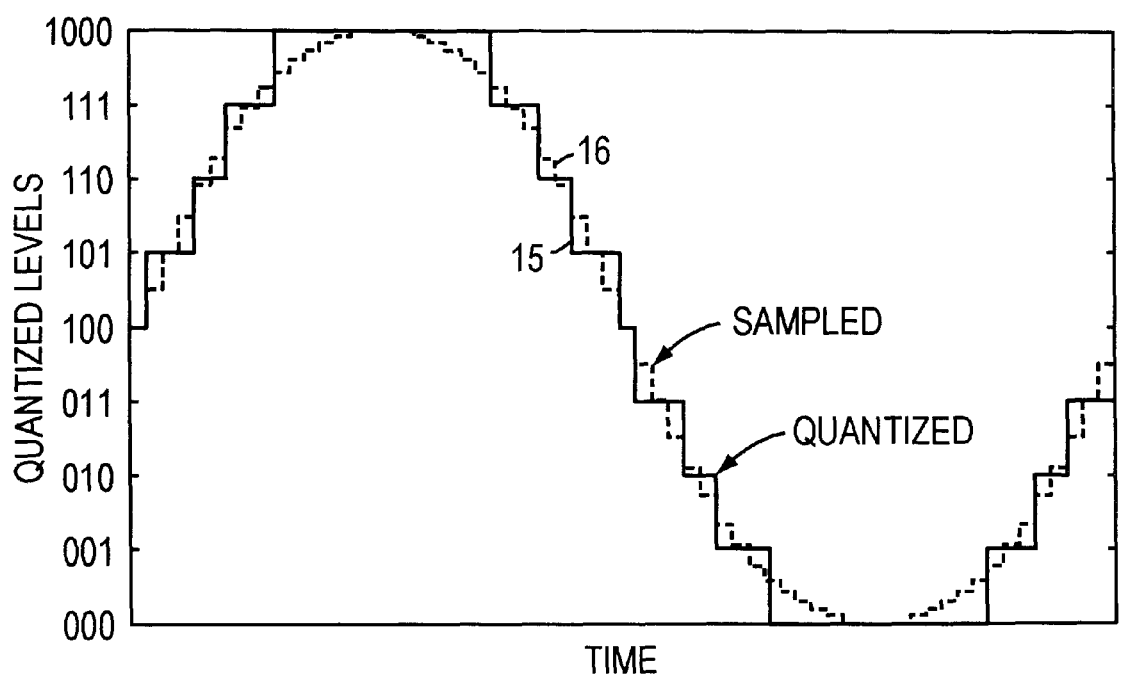
FIG. 3 is a graph showing quantization levels of a sampled signal in a typical analog to digital converter known to the prior art.

The result of the operation of the components of the analog to digital converter of FIG. 1 is illustrated in FIG. 2 and FIG. 3. In the most common implementation, the sampler 12 and the quantizer 14 operate at the same repetition rate ($f_{A/D}$). FIG. 2 illustrates operation of the sampler 12. The dashed line 15 represents an arbitrary analog input signal and a solid line 16 represents the output generated by periodically sampling the analog input signal. FIG. 3 illustrates operation of the quantizer 14. The same sampler output 16 from FIG. 2 is shown as a dashed line. The quantized levels 17 of the sampled signal is shown as a solid line. The embodiment shown in the illustration has nine quantized levels, labeled as binary values from 000 to 1000.

The minimum sampling frequency of a sampler is called the Nyquist rate. This refers to the minimum sampling rate necessary so that no information about the original signal is lost and the original signal can be reconstructed from the sampled signal. The quantization process adds noise that cannot be removed, so the number of quantization levels is determined by system performance requirements.

Aliasing is a phenomenon by which high signal frequencies can appear at the output of an A/D system as a signal present at a lower frequency. To prevent aliasing, the input signal is typically processed before sampling with a lowpass filter (as described above) having a bandwidth $B \leq f/2$, where f is the frequency of the sampling signal. This equation requires that the minimum sampling frequency, the Nyquist rate, is 2B. The spacing between samples or the period, is given by T=1/f and therefore the maximum sample spacing is given by ½B. If the equation 2B≦f is not satisfied, the resulting sampling of the real and aliased output signal causes any high signal frequency f'>f/2 to appear in the output at a lower frequency |f−f'|<B. This is defined as aliasing. In other words, if the sampling period is too large, an upper frequency component of the signal will be reflected as a lower frequency component of the signal. Aliasing is a phenomenon to be avoided because it will lead to distortion in the resulting output signal.

The performance of electrical A/D converters can be limited by the deviation from normal sampling rates of the sampler. This is sometimes referred to as timing jitter. The timing jitter of optical samplers can be much lower than the timing jitter for electrical samplers, but all-optical A/D converters have not achieved the high resolution required for many applications. This is due in part to resolution limitations of all-optical quantizers. The configuration of the optical sampler/electrical quantizer known to the prior art and illustrated in FIG. 4 has been disclosed as a means of combining the low timing jitter of optical samplers with the high resolution of electronic quantizers.

Optical samplers typically use optical modulators for sampling. These optical modulators have limitations. For example, for many applications, the linearity of a conventional optical modulator is not sufficient. The nonlinear sinusoidal transfer function of an optical modulator produces harmonics and intermodulation products. Such nonlinearities of the modulator can be mathematically modeled by expanding the transfer function of the modulator into a polynomial series. Second-order distortion products result from the quadratic term and third-order distortion products result from the third-order (or cubic) term of the polynomial series.

For ideal modulation, the optical transmission of the modulator varies linearly with the drive voltage applied to the modulator. Most modulators, however, exhibit the nonlinear response described above. The transmission of an interferometric modulator varies sinusoidally according to intensity, and the transmission characteristic of the modulator is referred to as the sinusoidal transfer function of the modulator. The power transmission of the modulator can be represented by the following equations:

$$P_{out}(t) = \frac{1}{2} P_{in}(t)[1 + \cos(\phi(t) + \theta)] \quad (1)$$

$$P_{out}(t) = \frac{1}{2} P_{in}(t)[1 + \cos(aV_{in}(t) + \theta)] \quad (2)$$

where $\phi(t)$ is proportional to $V_{in}(t)$ (the analog input signal to the modulator), and where $\theta$ is a phase bias voltage applied to the modulator. $P_{out}$ is the output power from the modulator. $P_{in}$ is the power of the input light signal at the optical input of the modulator. At the half-power point ($\theta = \pm \pi/2$), which corresponds to the maximum modulator sensitivity, the optical power can be approximated as:

$$P_{out}(t) = \frac{P_{in}(t)}{2\phi(t)} + \frac{P_{in}(t)}{16\phi(t)^3} + \text{higher order terms} \quad (3)$$

The cubic term in Eq. (3) is the component which leads to third-order intermodulation distortion. The time varying phase modulation term ($\phi(t)$) can be expressed as:

$$\phi(t) = \phi_m(\sin \omega_1 t + \sin \omega_2 t) \quad (4)$$

When the input modulating voltage is applied to the modulator to generate a modulated output signal, intermodulation distortion typically occurs because of the sinusoidal nature of the time-varying phase modulation in Eq. (4). It should be appreciated that optical modulators typically suffer from second, third, and higher-order intermodulation distortion. Second and third order intermodulation distortion products have the highest negative effect on the output signal of the optical modulator in terms of noise.

Figure 4:
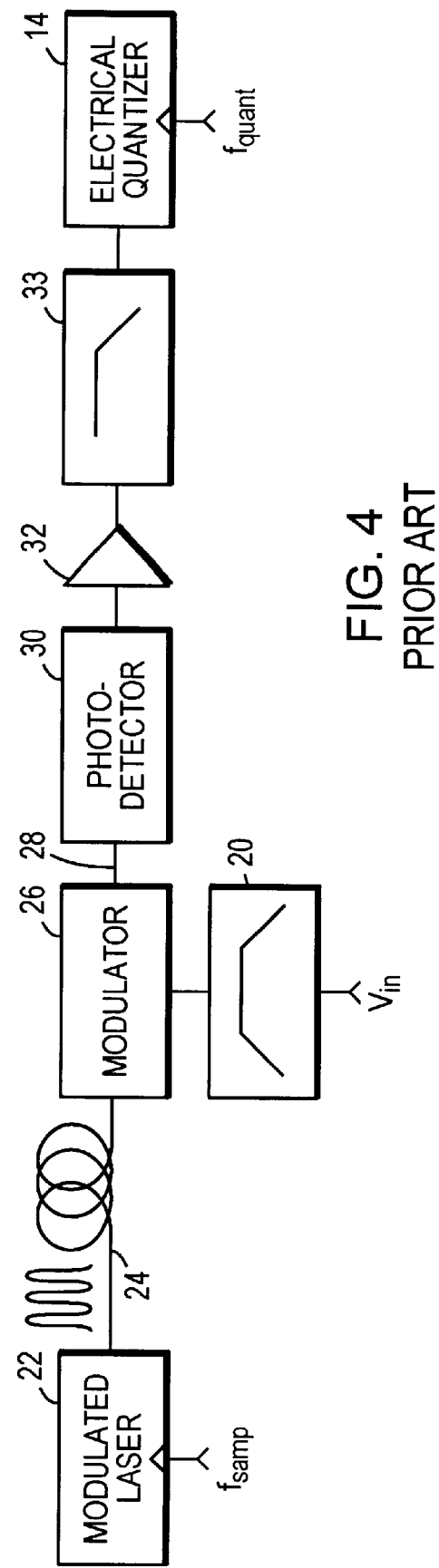
FIG. 4 is a block diagram of a prior art analog to digital converter using an optical sampler/electrical quantizer configuration with a modulated laser pulsed at the sampling rate.

Referring now to FIG. 4, therein is shown a prior art analog to digital converter (A/D) using an optical sampler with an electrical quantizer. The optical source 22 is a laser modulated at a sampling rate ($f_{samp}$). The laser may be Q-switched or have some other means of modulation. The output of laser 22 is optically coupled to an optical input of optical modulator 26. In one implementation, the coupling between laser 22 and modulator 26 is by polarization preserving optical fiber 24. Since optical modulator 26 is not linearized, all higher-order intermodulation distortion products will be present at the output of the modulator 26. This intermodulation distortion arises from the nonlinear sinusoidal transfer function of the optical modulator 26. Such intermodulation distortion appears at the output of the optical modulator 26.

The optical modulator 26 also requires an analog electrical input signal ($V_{in}$) which drives the optical modulator 26. In one embodiment, this signal passes through an optional electrical filter 20. The output of electrical filter 20 is connected to the electrical input of optical modulator 26. For a broadband analog electrical input signal, filter 20 could be a lowpass filter (not shown). In another embodiment, for a narrowband analog electrical input signal, filter 20 may be bandpass filter as shown.

The output signal of optical modulator 26 is a modulated optical signal, which is the analog electrical input signal ($V_{in}$) modified by the optical input signal. The output of optical modulator 26 is optically coupled to a photodetector 30. In one embodiment, the coupling between optical modulator 26 and photodetector 30 is by optical fiber 28. If a higher amplitude signal is required, an electrical amplifier 32 amplifies the output of photodetector 30. A lowpass filter 33 electrically filters the output signal of amplifier 32. The output of lowpass filter 33 is in electrical communication with quantizer 14. Quantizer 14 quantizes the output of lowpass filter 33 to discrete levels. Typically, for broadband analog input signals, the optical sampler/electrical quantizer configuration shown in FIG. 4 has the quantizer operating at the same clock rate as the optical sampler. This sets the frequency limit for the bandwidth of the digitized signal to half of the sampling frequency ($\frac{1}{2}$)$f_{samp}$, in order to preserve the Nyquist criteria. Frequencies in the input signal which are greater than ($\frac{1}{2}$)$f_{samp}$ are aliased and will appear as signals of a lower frequency.

Figure 5A:
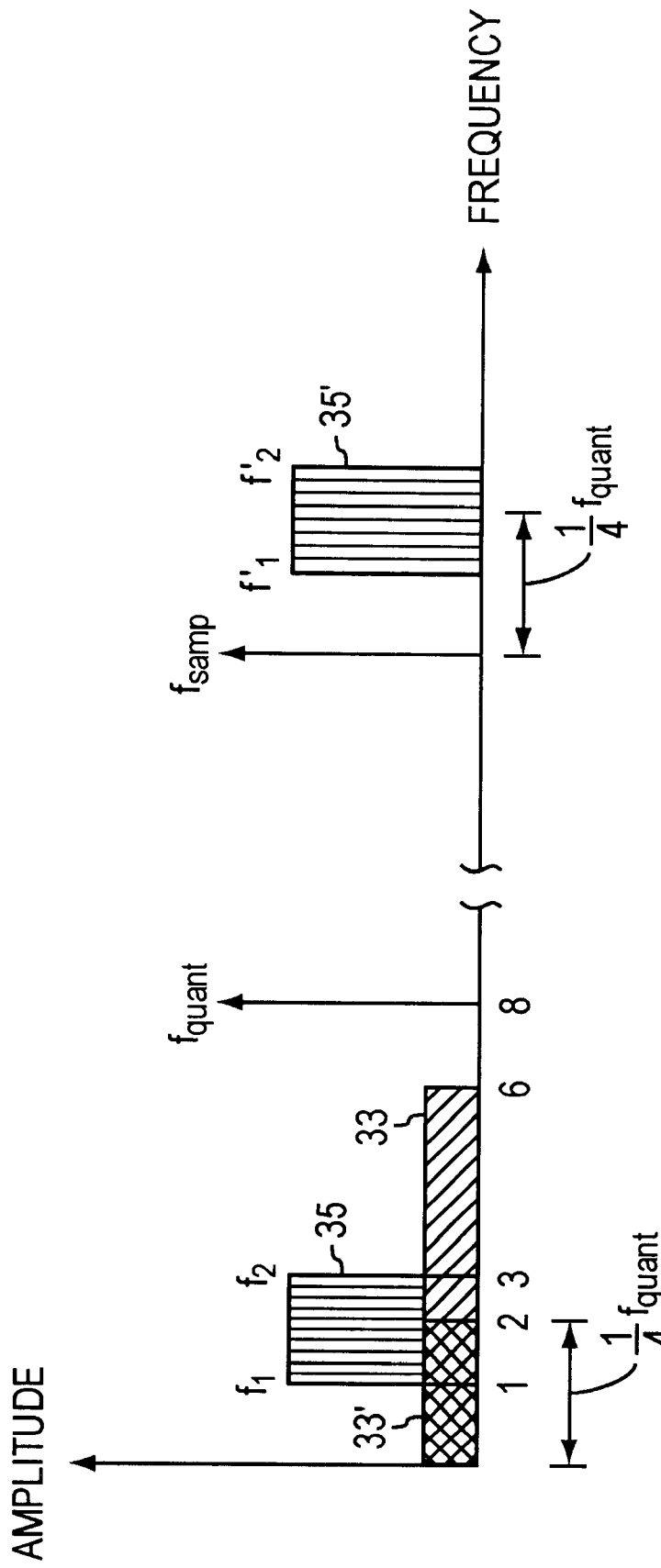
FIG. 5a is a graph of amplitude versus frequency for the prior art analog to digital converter of FIG. 4 showing second order distortion in the output signal.

Referring to FIG. 5a, in the optical sampler/electrical quantizer implementations known to the prior art, the optical sampling circuit including the optical modulator converts the input signal band to a baseband frequency range of between zero and ($\frac{1}{2}$)$f_{quant}$. Lowpass filter 34 rejects any frequencies greater than ($\frac{1}{2}$)$f_{quant}$ that would be aliased into the output band by the sampler. The actual input bandwidth could be smaller depending on the actual bandwidth of filters 20 and 33 and the overlap of the frequencies between the filters.

The RF spectrum corresponding to the operation of a conventional prior art optical sampler/electrical quantizer configuration of FIG. 4 with a narrowband analog input signal is shown in FIG. 5a. By the Nyquist criteria, the usable frequency bandwidth of the sampler is between zero and ($\frac{1}{2}$)$f_{quant}$. Therefore, the average center frequency of the input frequency band 35' is typically at ($\frac{1}{4}$)$f_{quant}$. In this example, the minimum frequency in the input frequency band is at ($\frac{1}{8}$)$f_{quant}$ and the maximum frequency in the input frequency band is at ($\frac{3}{8}$)$f_{quant}$. Combinations of frequencies in the input band generate the second-order intermodulation distortion terms. One such second order intermodulation distortion term is from zero to the difference between two fundamental frequencies. Another such term is from two times one fundamental frequency to two times another fundamental frequency. These second order distortion terms are generally closest to the sampled input band. In fact, for the conventional configuration shown, the second-order intermodulation distortion components 33 and 33' fall in the same frequency band as the aliased sampled input band 35. This is undesirable since the distortion cannot easily be removed from the sampled input band 35.

As an example, for $f_{quant}=8M_{sample}$/sec, the input signal band is converted to a baseband frequency range with an average center frequency of ($\frac{1}{4}$)$f_{quant}$. Therefore, the sampled input band has a frequency range between two fundamental tones ($f_1,f_2$) of 1 MHz and 3 MHz. Second order intermodulation distortion bands appear between zero to the difference between the two fundamental frequencies (2 MHz) and from two times one fundamental frequency (2 MHz) to two times the other fundamental frequency (6 MHz). Hence, for $f_{quant}=8M_{sample}$/sec, the second order intermodulation distortion bands appear in the sampled band 35 at (0 MHz to 2 MHz) 33' and (2 MHz to 6 MHz) 33, as shown in FIG. 5a. In general, in order to keep the second order intermodulation distortion bands outside of the sampled input band the following must be true:

$$2f_1 > f_2 \qquad (5)$$

Figure 5B:
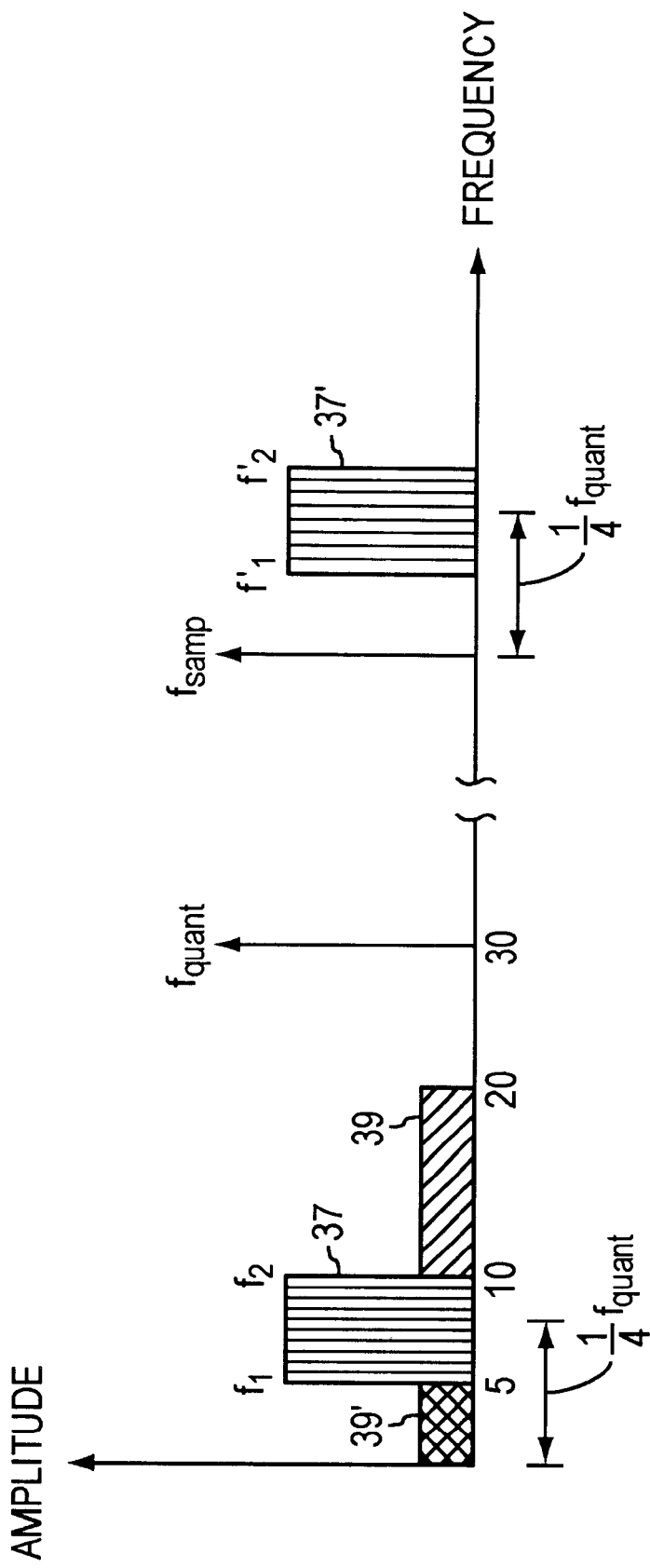
FIG. 5b is another graph of amplitude versus frequency for the prior art analog to digital converter of FIG. 4 showing second order distortion near the output signal.

Referring now to another embodiment of prior art shown in FIG. 5b, for $f_{quant}=30M_{sample}$/sec, the input signal band is converted to a baseband frequency range with an average center frequency of ($\frac{1}{4}$)$f_{quant}$. In this example, the sampled input band has a frequency range between two findamental tones ($f_1,f_2$) of 5 MHz and 10 MHz, the second order intermodulation distortion bands appear outside the sampled input band 37 at between (0 MHz to 5 MHz) 39' and between (10 MHz to 20 MHz) 39. In this case, it will be difficult to filter out the second order intermodulation distortion bands, since they are located right at the edges of the sampled input band 37. Values for $f_1$ and $f_2$ which do not satisfy Eq. (5), will violate the Nyquist criteria.

For analog electrical input signals with very narrow signal bandwidth, the optical sampler including optical modulator 26 and the electrical quantizer 14 each could sample at twice the bandwidth of the electrical input signal ($V_{in}$), which in many cases is still at a much lower rate than twice the frequency of the electrical input signal ($V_{in}$). However, high sampling rates are preferred for optical samplers, because nonlinear effects such as intermodulation distortion can be reduced at higher sampling rates. Also, lower timing jitter for optical sources typically can be achieved using higher sampling rates.

The problems associated with prior art optical sampler/electrical quantizer analog-to-digital converters, such as keeping second order intermodulation distortion out of the input band, are solved with the present invention.

Figure 6:
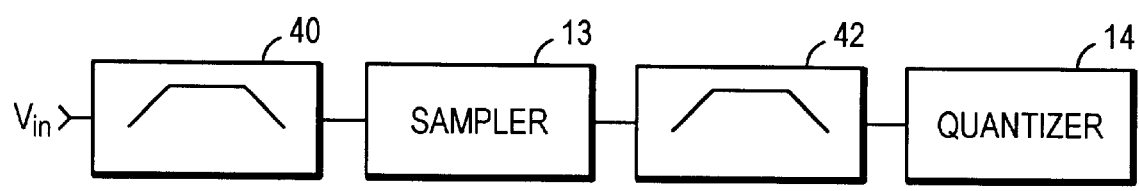
FIG. 6 is a block diagram of an embodiment of the analog to digital converter of the invention.

One embodiment of the narrowband analog to digital converter constructed in accordance with the present invention is shown in FIG. 6. An electrical filter 40 in one embodiment is used to remove undesired frequencies which are outside the band of the desired analog input frequency. If not filtered by electrical filter 40, these undesired frequencies could be aliased and appear in the output of the sampler at the same frequencies as the desired input band. In one embodiment, electrical filter 40 is a bandpass filter. Sampler 13 repetitively samples the analog signal at the output of optional filter 40. The output of the sampler 13 passes through a bandpass filter 42 that has a center frequency which is greater than half the quantizer sampling rate. This bandpass filter 42 is necessary to filter out second-order distortion products which are generated by sampler 13. If bandpass filter 42 had a center frequency of less than half the quantizer sampling rate, second-order distortion products could appear at the input of the quantizer 14. Bandpass filter 42 also removes undesired frequency components that could be aliased into the sampled band by sampler 13. The quantizer 14 is in electrical communication with bandpass filter 42. Quantizer 14 converts the output of the bandpass filter 42 into a sequence of values corresponding to the quantization levels.

In one embodiment, the present invention employs a linear modulator in the sampler which permits significant second-order distortion but controls third-order distortion very well. In fact, the third-order distortion of the embodiment is negligible.

Figure 7A:
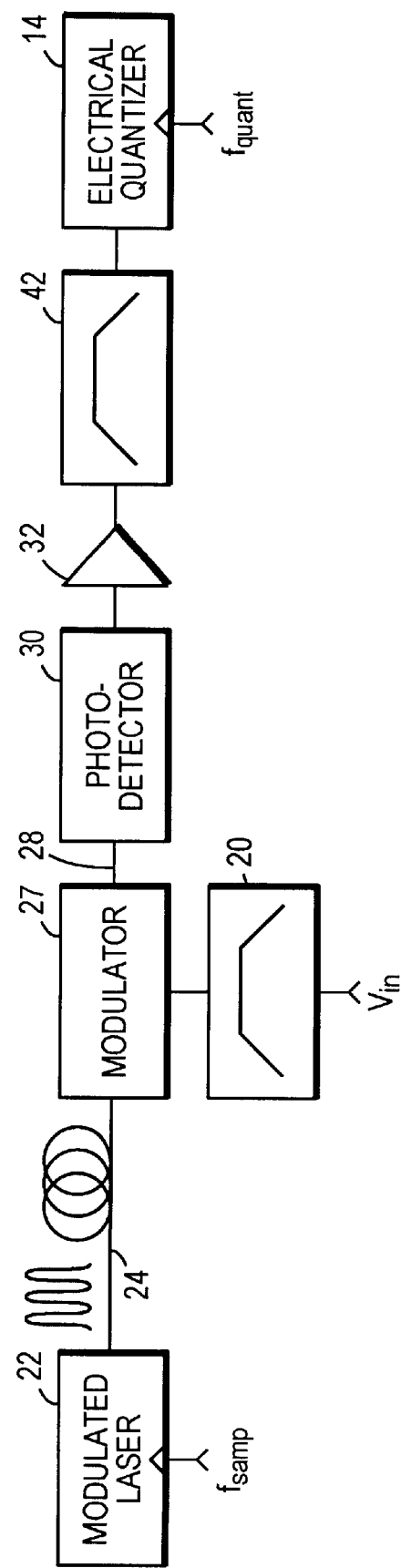
FIG. 7a is a block diagram of an alternate embodiment of the invention using an optical sampler.

Another embodiment of the narrowband analog to digital converter with suppressed second-order distortion of the present invention is shown in FIG. 7a. The embodiment shown in FIG. 7a is similar to the embodiment shown in FIG. 6 with the sampler 13 replaced by an optical sampler including linearized optical modulator 27. Modulated laser 22 is in optical communication with optical modulator 27. In one embodiment, this optical communication is accomplished through the use of optical fiber 24. Optical modulator 27 includes an analog electrical input signal ($V_{in}$) which, in one embodiment, is connected to optical modulator 27 through electrical bandpass filter 20. Electrical bandpass filter 20 is chosen to filter out unwanted frequencies in the electrical input signal ($V_{in}$). The output of linearized optical modulator 27, in one embodiment, is connected through optical fiber 28 to photodetector 30. Photodetector 30 converts the modulated optical signal generated by linearized optical modulator 27 into electrical signals. If a higher amplitude signal is required, an electrical amplifier 32 amplifies the output of photodetector 30. A bandpass filter 42 electrically filters the output signal of amplifier 32. The output of bandpass filter 42 is in electrical communication with electrical quantizer 14. Electrical quantizer 14 quantizes the output of bandpass filter 42 to discrete levels.

Figure 7B:
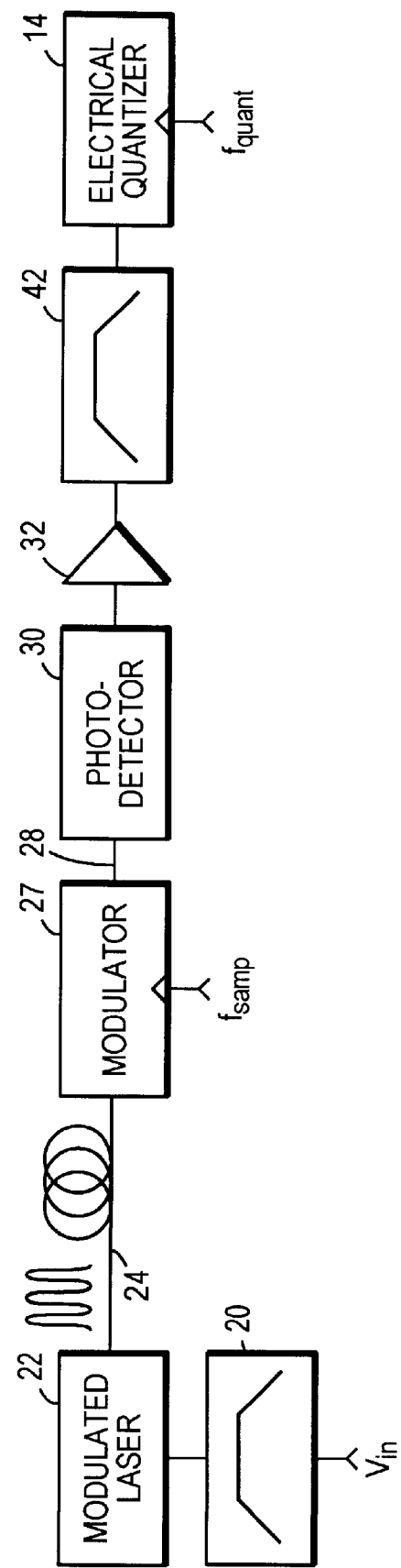
FIG. 7b is a block diagram of another embodiment of the invention using an optical sampler.

A further embodiment of the narrowband analog to digital converter with suppressed second-order distortion of the present invention is shown in FIG. 7b. The embodiment shown in FIG. 7b is similar to the embodiment shown in FIG. 7a with the optical source 22 being modulated by the analog electrical input signal ($V_{in}$) and the linearized optical sampler 27 being modulated by sampling frequency ($f_{samp}$). Modulated laser 22 is in optical communication with optical modulator 27. In one embodiment, this optical communication is accomplished through the use of optical fiber 24. In one embodiment, optical source 22 includes optical input ($V_{in}$) which is connected to bandpass filter 20. Optical modulator 27 includes an electrical modulation input of sampling frequency ($f_{samp}$). Electrical bandpass filter 20 is chosen to filter out unwanted frequencies in the electrical input signal ($V_{in}$). The output of linearized optical modulator 27, in one embodiment, is connected through optical fiber 28 to photodetector 30. Photodetector 30 converts the modulated optical signal generated by linearized optical modulator 27 into electrical signals. If a higher amplitude signal is required, an electrical amplifier 32 amplifies the output of photodetector 30. A bandpass filter 42 electrically filters the output signal of amplifier 32. The output of bandpass filter 42 is in electrical communication with electrical quantizer 14. Electrical quantizer 14 quantizes the output of bandpass filter 42 to discrete levels.

In one embodiment of the optical sampler/electrical quantizer of the present invention, the optical sampling frequency ($f_{samp}$) is close to the center frequency of the input analog signal ($V_{in}$). Therefore, the electrical quantizer 14 can sample at a much lower frequency than the frequency of the optical sampler ($f_{samp}$) without losing any information about the input signal.

Figure 8:
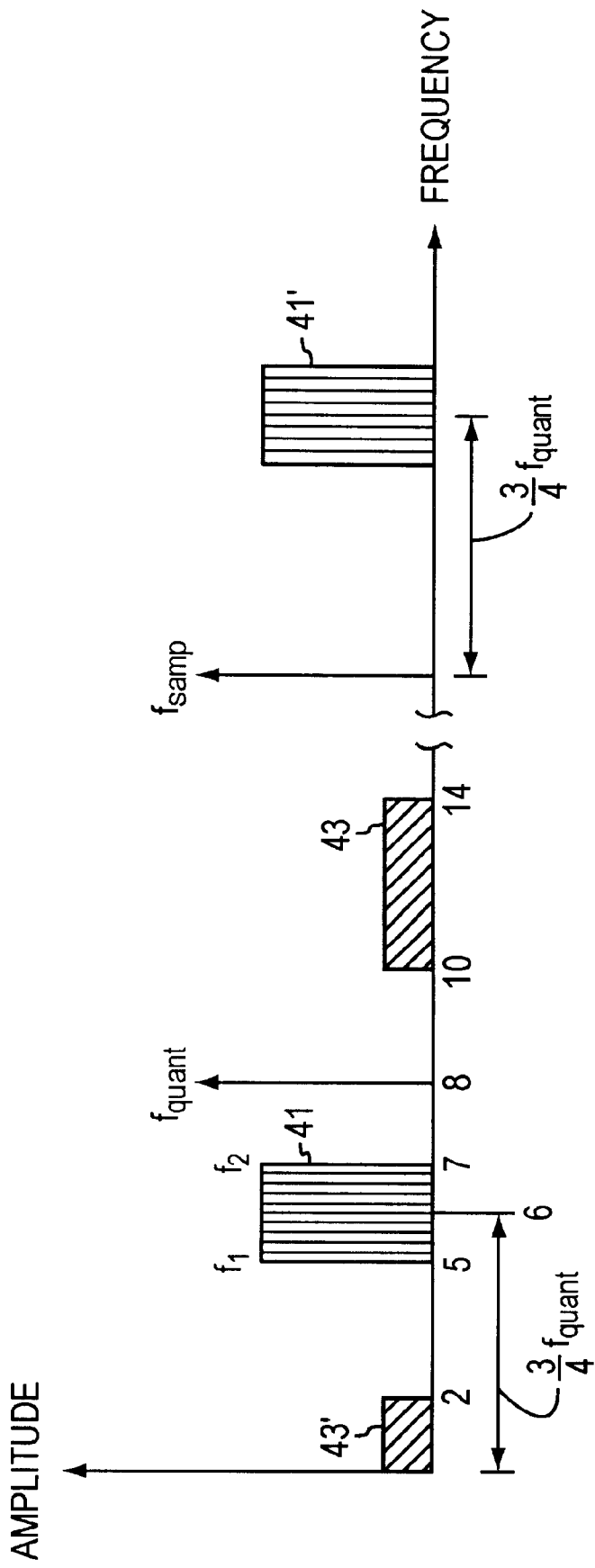
FIG. 8 is a graph of amplitude versus frequency for the embodiment of the invention shown in FIG. 7a showing second order distortion not in the output signal.

FIG. 8 shows the corresponding amplitude versus frequency spectrum produced by the embodiment of the invention shown in FIG. 7a. Instead of using the lower half of the usable bandwidth, zero to $(\frac{1}{2})f_{quant}$, in this embodiment the upper half of the bandwidth is used, $(\frac{1}{2})f_{quant}$ to $f_{quant}$. In this example, the input band 41' is spaced by approximately $(\frac{3}{4})f_{quant}$ from the closest harmonic of the sampling frequency ($f_{samp}$). The sampled output 41 is aliased to $(\frac{3}{4})f_{quant}$.

The average center frequency of the input frequency band 41' is at $(\frac{3}{4})f_{quant}$. The minimum frequency in the input frequency band is at $(\frac{5}{8})f_{quant}$ and the maximum frequency in the input frequency band is at $(\frac{7}{8})f_{quant}$. In this embodiment, the second order intermodulation terms appear at zero to $(\frac{1}{4})f_{quant}$ and $(\frac{5}{4})f_{quant}$ to $(\frac{7}{4})f_{quant}$. For the embodiment shown, the second-order intermodulation distortion components 43 and 43' fall outside the aliased sampled input band 41. This is desirable since the distortion can now easily be removed from the sampled input band using a bandpass filter 42.

For example, for $f_{quant}=8M_{sample}/\text{sec}$, the input signal band 41' is converted to a baseband frequency range with an average center frequency of $(\frac{3}{4})f_{quant}$. Therefore, the sampled input band 41 has a frequency range between two fundamental tones ($f_1, f_2$) of 5 MHz and 7 MHz. Second order intermodulation distortion bands appear between zero to $(\frac{1}{4})f_{quant}$ and between $(\frac{5}{4})f_{quant}$ to $(\frac{7}{4})f_{quant}$. Hence, for $f_{quant}=8M_{sample}/\text{sec}$, the second order intermodulation distortion bands 43' and 43 appear in the sampled band at (0 MHz to 2 MHz) and (10 MHz to 14 MHz), respectively, as shown in FIG. 8.

One advantage of the embodiment of FIG. 7a is that second-order distortion products 43 and 43' after sampling are separated from the desired sampled spectrum, as shown in FIG. 8, and can be rejected using bandpass electrical filter 42 after the photodetector 30.

The use of optical linearization, electrical linearization, or digital linearization to improved performance of optical sampler/electrical quantizer configurations has been previously disclosed. See J. Twichell et al., "Linearized Optical Sampler", U.S. Pat. No. 5,955,875, incorporated herein by reference. The use of modulator structures with third-order linearization was disclosed in that patent application.

Figure 9:
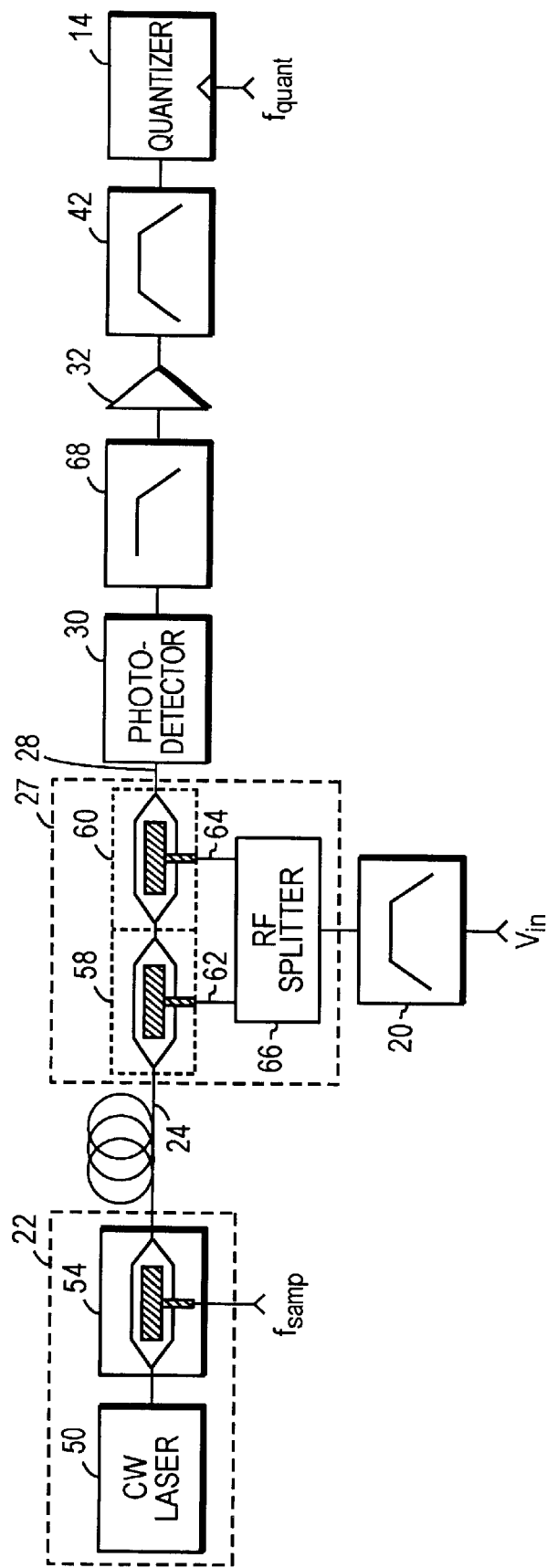
FIG. 9 is a block diagram of an alternate embodiment of the invention using a linearized optical sampler.

An embodiment of an optical sampler/electrical quantizer configuration with suppressed second-order distortion is shown in FIG. 7a has been reduced to practice using a third-order linearized modulator in an embodiment shown in FIG. 9. In this embodiment, a 400 mW CW laser 50 followed by an external optical modulator 54 is used to generate the optical sampling signal. The optical modulator 54 in one embodiment is an overdriven Mach-Zehnder modulator 54, which produces optical modulation that is approximates a square wave. It will be appreciated by those skilled in the art that other optical sources could be used as the optical sampling signal, such as a mode-locked laser or a gain-switched laser. In fact, it has been contemplated by the invention that any modulated optical signal that can be generated, may be used as the optical sampling signal.

The laser 50, in one embodiment, is a Nd:YLF solid state crystal and operates at a wavelength of approximately 1.3 $\mu$m. In another embodiment, optical modulator 54 is biased at quadrature, which is the half-power point, as previously discussed. The modulated light is used to sample the electrical input in third-order linearized modulator 27. Linearized optical modulator 27 in one embodiment includes two Mach-Zehnder optical modulators 58 and 60 connected in series. Electrical inputs 62 and 64 are derived by RF power splitter 66 which splits electrical input signal ($V_{in}$) into two equal electrical signals.

The average photocurrent at photodetector 30 is approximately 3 mA and is followed by a 100 MHz lowpass filter 68 and an amplifier 32. In one embodiment, the amplifier 32 includes a UTO509 preamplifier and a PA15 high-linearity amplifier. The output of the amplifier 32 is coupled to the input of a 15 MHz bandpass filter 42 which is connected to quantizer 14. In one embodiment, quantizer 14 is a Hewlett-Packard E1437A digitizer.

In operation, optical modulator 54 modulates the optical signal generated by laser 50. In one embodiment the laser is a semiconductor diode laser. In another embodiment, the modulated optical input is generated by a mode-locked laser. In yet another embodiment, the modulated optical unit is generated by a gain-switched laser. In another embodiment, the sampler is an optical modulator which uses optical modes from an input laser or uses the optical modes from more than one laser. In yet another embodiment, a distributed feedback semiconductor laser diode is used as the optical source to generate the optical sampling signal. Other possible optical sources include, but are not limited to, Fabry-Perot semiconductor laser diodes, surface emitting semiconductor lasers, optical fiber lasers, or solid-state lasers such as Nd:YLF. Other laser sources known to those skilled in the art could also be used.

The modulated optical signal is then injected into the optical input of linearized optical modulator 27. One embodiment of the linearized optical modulator 27 of the present invention uses a Mach-Zehnder optical modulator fabricated on a Lithium Niobate substrate for the optical sampler. This Mach-Zehnder modulator could be operated at a low modulator bias to reduce the average optical output power and reduce the effect of noise from the optical source. The optical sampler could also be two modulators in series 58 and 60 (as shown), a reflective full-coupler modulator, a reflective half-coupler modulator, a directional coupler modulator, or an electroabsorption modulator. A variety of other interferometric or non-inferometric modulator structures can be used for the optical sampler. In one embodiment, a polarization maintaining fiber 24 is used between the optical source 22 and the linearized optical modulator 27 used for sampling the analog input signal ($V_{in}$).

The electrical input signal ($V_{in}$) is filtered by bandpass filter 20, before being split by RF splitter 66. RF splitter 66 splits the filtered electrical input signal ($V_{in}$) between modulators 58 and 60, which are connected in series. The electrical input signal ($V_{in}$) drives modulators 58 and 60. The output of linearized optical sampler 27 is coupled to the input of optical fiber 28. Photodetector 30 then converts the optically sampled signals from optical fiber 28 to electrical signals. In one embodiment, lowpass filter 68 receives the electrical signals from photodetector 30 and rejects those signals which are above a specific frequency. In one embodiment, lowpass filter 68, rejects frequencies above 100 MHz. Allowed frequencies will be amplified by amplifier 32, before passing through bandpass filter 42. In one embodiment, bandpass filter 42 is a narrow bandpass filter. In another embodiment bandpass filter 42 is a 15 MHz filter. The output of bandpass filter 42 is coupled to the input of quantizer 14. Quantizer 14 quantizes the sampled electrical signal to generate a digital representation of the analog electrical input signal ($V_{in}$).

In one embodiment, the optical source includes an optical isolator (not shown). In another embodiment, an optical amplifier (not shown) is used to increase the optical power of the modulated optical signal used to sample the input analog signal. In yet another embodiment, the optical amplifier is placed before the optical sampling modulator. In another embodiment, an optical filter (not shown) could be used after any optical amplifier to reduce the optical noise from the amplifier.

Another embodiment of the invention uses a low intensity-noise laser, so that suppression of the optical intensity noise is not needed. However, optical intensity noise can be substantially suppressed by other techniques known to the art. One common differential noise suppression configuration uses two complementary outputs of a Mach-Zehnder modulator.

Figure 10A:
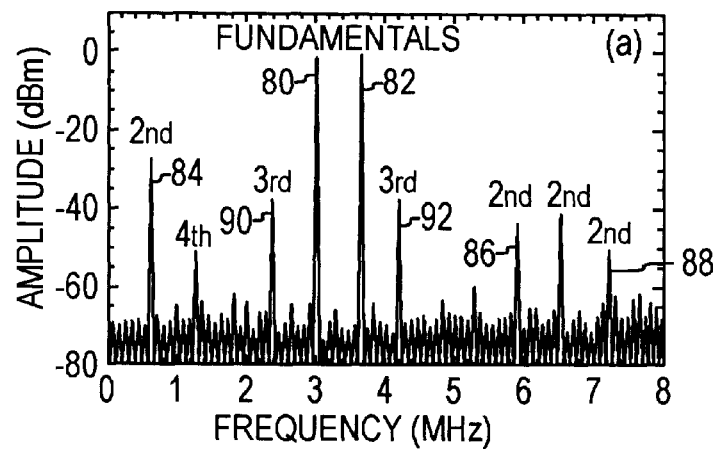
FIG. 10a is a graph of amplitude versus frequency for a prior art embodiment of an optical analog to digital converter using a non-linear optical sampler.

FIG. 10a illustrates experimental results of an optical sampler/electrical quantizer A/D converter configured to behave like a typical prior art system of FIG. 4. The system was tested using an electrical analog input signal ($V_{in}$) consisting of a two-tone input signal at 439 MHz and 439.6 MHz. The following parameters were used. The optical sampling rate into modulator 54 was 436.02 MHz, the quantizer clock rate was 20.48 Msample/sec, and the sample time was 0.8 ms. The Fourier transform of the experimental data is shown in FIG. 10a, with the sampled tones 80 and 82 centered at 3.28 MHz and having values of 2.98 MHz and 3.58 MHz, respectively. A second-order intermodulation distortion product 84 at 26 dB below the fundamental tones can be seen at 0.6 MHz generated by the optical modulator. Other second-order intermodulation products 86 and 88 can be seen at 5.96 MHz and 7.16 MHz, respectively. Third-order intermodulation products 90 and 92 can be seen straddling the fundamentals, 80 and 82. It will be difficult to design a bandpass filter which will remove the third-order intermodulation distortion products 90 and 92 while allowing only the sampled band to pass.

Figure 10B:
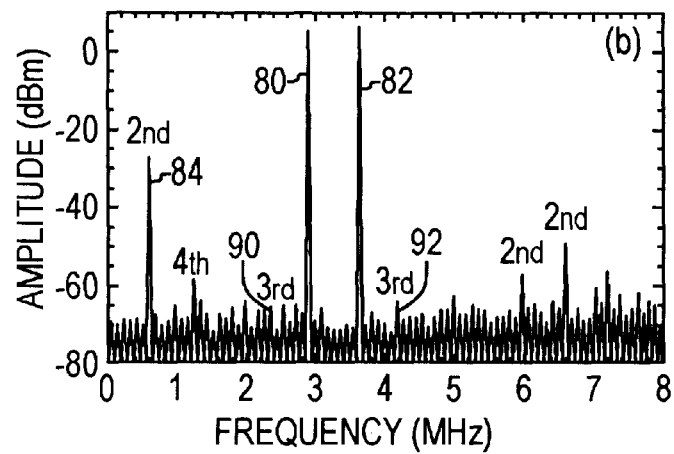
FIG. 10b is a graph of amplitude versus frequency for an embodiment of an optical analog to digital converter according to the present invention using a linearized optical sampler without filtering the higher order distortion products.

To generate the RF spectrum illustrated in FIG. 8, the sampling frequency in the experiment is shifted to 422.1 MHZ so that the sampled tones are centered at 17.2 MHz and have values of 16.9 MHz and 17.5 MHz, respectively (not shown). A second-order intermodulation distortion product 84 at 26 dB below the fundamental tones can be seen at 0.6 MHz generated by the optical modulator. Other second-order intermodulation products are at 33.8 MHz and 35 MHz, respectively (not shown). The digitized output is shown in FIG. 10b, where the digitized tones 80 and 82 appear to be at the same frequency as in FIG. 10a because of aliasing in the A/D converter. Aliasing reflects the sampled tones 16.9 MHz and 17.5 MHz down to 3.58 MHz and 2.98 MHz, respectively as shown in FIG. 10b. The linearized optical modulator is optimized to reduce third-order intermodulation distortion. FIG. 10b shows the reduction in third-order intermodulation distortion at tones 90 and 92. The second-order distortion was reduced due to the frequency response of the amplifiers, which have higher gain and lower noise at 17 MHz. However, significant second-order intermodulation distortion 84 still appears at 0.6 MHz.

Figure 10C:
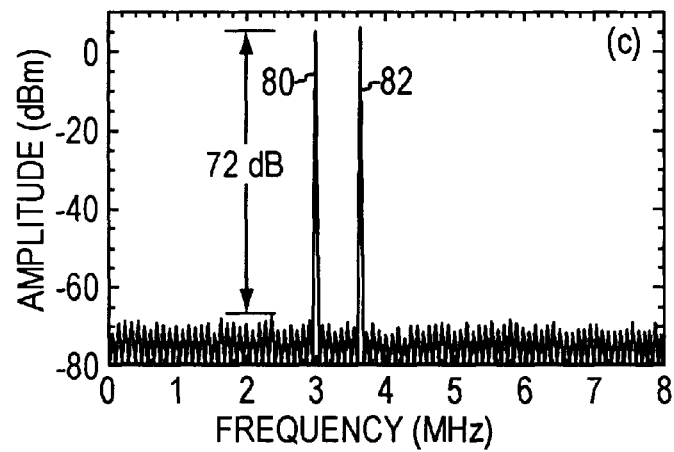
FIG. 10c is a graph of amplitude versus frequency for an embodiment of an optical analog to digital converter of the present invention using a linearized optical sampler with a bandpass filter for filtering the higher order distortion products.

FIG. 10c illustrates the experimental results obtained by introducing bandpass filter 42 before quantizer 14 as shown in the embodiment of FIG. 9. Bandpass filter 42 eliminates the second-order intermodulation distortion products before the fundamental tones are aliased by the AID converter. The results are shown in FIG. 10c. As shown, second-order intermodulation distortion products are substantially eliminated. Also, third-order intermodulation products are 72 dB below the fundamental tones 80 and 82. The signal to noise ratio also improves due to the absence of low frequency laser and amplifier noise.

Having described and shown the preferred embodiments of the invention, it will now become apparent to one of skill in the art that other embodiments incorporating the concepts may be used and that many variations are possible which will still be within the scope and spirit of the claimed invention. It is felt, therefore, that these embodiments should not be limited to disclosed embodiments but rather should be limited only by the spirit and scope of the following claims.

We claim:

1. An apparatus for digitizing a narrowband analog electrical signal, the apparatus comprising:
    a) a linearized sampler, the sampler having an analog electrical input and a sampler output, the sampler sampling the narrowband analog electrical signal;
    b) a bandpass filter having a bandpass input in communication with the sampler output and having a bandpass output, wherein the bandpass filter removes distortion generated by the linearized sampler; and
    c) a quantizer having a quantizer input in communication with the bandpass output,
        wherein the bandpass filter has a center frequency of at least half of the quantization rate of the quantizer and wherein the quantizer digitizes the sampled narrowband analog electrical signal.

2. The apparatus of claim 1 wherein the bandpass filter is electrical.

3. A method for digitizing a narrowband analog electrical signal, the method comprising:
    a) sampling a narrowband analog electrical signal using a linearized sampler thereby generating a sampled narrowband analog electrical signal;
    b) filtering the sampled narrowband analog electrical signal to remove distortion generated by the linearized sampler thereby generating a filtered narrowband analog electrical signal; and
    c) quantizing the filtered sampled narrowband analog electrical signal to generate a digitized signal,
        wherein a filter performing the filtering step has a center frequency of at least half of a quantization rate of a quantizer performing the quantizing step.

4. An apparatus for digitizing a narrowband analog electrical signal, the apparatus comprising:
    a) an optical source generating a modulated optical signal;
    b) an optical modulator in communication with the optical source, the optical modulator including a electrical input port for receiving the narrowband analog electrical input signal and an optical input port for receiving the modulated optical signal, wherein the optical modulator samples the narrowband analog electrical input signal;
    c) an optical to electrical converter having a converter output and a converter input in communication with the optical modulator, the converter generating a sampled electrical signal at the converter output in response to the signal received at the converter input;
    d) a bandpass filter having a bandpass output and a bandpass input in communication with the converter output, the bandpass filter removing distortion generated by the optical modulator; and
    e) a quantizer having a quantizer input in communication with the bandpass output,
        wherein the bandpass filter has a center frequency of at least half of the quantization rate of the quantizer, and wherein the quantizer digitizes the electrical signal.

5. The apparatus of claim 4 wherein the modulated optical signal is modulated at the sampling frequency.

6. The apparatus of claim 4 wherein the modulated optical signal is generated by a gain-switched laser.

7. The apparatus of claim 4 wherein the modulated optical signal is generated by a mode-locked laser.

8. The apparatus of claim 4 wherein the optical modulator comprises an electro-optic interferometric modulator.

9. The apparatus of claim 8 wherein the modulator comprises a Fabry-Perot interferometric modulator.

10. The apparatus of claim 8 wherein the modulator comprises a Mach-Zehnder interferometric modulator.

11. The apparatus of claim 4 wherein the optical modulator comprises a directional coupler.

12. The apparatus of claim 4 wherein the optical modulator is formed on a monolithically integrated substrate.

13. The apparatus of claim 4 wherein the bandpass filter is electrical.

14. The apparatus of claim 4 wherein the optical to electrical converter comprises a photodetector.

15. The apparatus of claim 4 wherein the modulated optical signal is generated by a laser.

16. The apparatus of claim 4 wherein the modulated optical signal is generated by a semiconductor laser diode.

17. The apparatus of claim 4 wherein the modulated optical signal is generated by a Fabry-Perot semiconductor laser diode.

18. The apparatus of claim 4 wherein the modulated optical signal is generated by a surface emitting semiconductor laser.

19. The apparatus of claim 4 wherein the modulated optical signal is generated by an optical fiber laser.

20. The apparatus of claim 4 wherein the modulated optical signal is generated by a solid state laser.

21. The apparatus of claim 4 further comprising an optical isolator in communication with the modulated optical signal.

22. The apparatus of claim 4 further comprising an optical amplifier in communication with the modulated optical signal.

23. The apparatus of claim 22 further comprising an optical filter in communication with the optical amplifier.

24. The apparatus of claim 4 wherein the optical modulator comprises a Mach-Zehnder optical modulator.

25. A method for digitizing a narrowband analog electrical input signal, the method comprising:
    a) receiving a modulated optical input signal;
    b) sampling the narrowband analog electrical input signal by combining the narrowband analog electrical input signal and the modulated optical input signal in a linearized optical modulator to generate a modified optical signal;
    c) converting the modified optical signal into an electrical signal, thereby generating a sampled electrical signal;
    d) bandpass filtering the sampled electrical signal to remove distortion generated by the linearized optical modulator, thereby generating a filtered electrical signal; and
    e) quantizing the filtered electrical signal to generate a digitized signal,
        wherein the bandpass filter has a center frequency of at least half of the quantization rate of the quantizer.

26. The method of claim 25 further comprising the step of amplifying the electrical signal after performing step d).

27. The method of claim 25 wherein the optical signal is modulated at the sampling frequency.

28. The method of claim 25 further comprising the step of modulating the optical source at a frequency substantially different than a center frequency of the input RF signal to alias a bandwidth of interest to a different frequency.

29. An apparatus for digitizing a narrowband analog electrical signal, the apparatus comprising:

a) an optical source generating an optical input signal, the optical input signal being modulated at the sampling frequency;

b) a linearized optical modulator in optical communication with the optical source, the optical modulator having an electrical input for receiving the narrowband analog electrical input, the linearized optical modulator generating an optical signal corresponding to the modulated input signal and the narrowband analog electrical input;

c) an optical to electrical converter having a converter output and a converter input in communication with the optical modulator, the converter generating an electrical signal at the converter output corresponding to the optical signal;

d) an electrical bandpass filter having a bandpass output and a bandpass input in communication with the converter output, the bandpass filter removing distortion generated by the linearized optical modulator; and e) a quantizer in communication with the bandpass output, wherein the electrical bandpass filter has a center frequency of at least half of the quantization rate of the quantizer, and wherein the quantizer digitizes the electrical signal.

30. The apparatus of claim 29 wherein the modulation of the optical signal is achieved by varying an output signal of an optical source.

31. The apparatus of claim 29 wherein the modulated optical signal comprises optical pulses.

* * * * *